United States Patent
Fukuda et al.

(10) Patent No.: US 6,286,711 B1
(45) Date of Patent: Sep. 11, 2001

(54) FEEDER FOR ELECTRONIC CHIP COMPONENTS

(75) Inventors: Kenichi Fukuda, Sabse; Kouichi Nakada, Komatsu, both of (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/237,680

(22) Filed: Jan. 27, 1999

(30) Foreign Application Priority Data

Jan. 27, 1998 (JP) .................................................. 10-013687

(51) Int. Cl.[7] .............................. G07F 11/00; G07F 11/46; A24F 15/04
(52) U.S. Cl. ............................ 221/13; 221/186; 221/121; 221/122; 221/211
(58) Field of Search .................................. 221/13, 15, 18, 221/186, 211, 113, 119, 121, 122

(56) References Cited

U.S. PATENT DOCUMENTS

| | | | | |
|---|---|---|---|---|
| 4,953,749 | * | 9/1990 | Kubota et al. | 221/211 X |
| 5,405,045 | * | 4/1995 | Usmani | 221/15 X |
| 5,605,249 | * | 2/1997 | Gonyea | 221/121 X |
| 5,625,334 | * | 4/1997 | Compton | 221/15 X |
| 5,646,912 | * | 7/1997 | Cousin | 221/15 X |
| 5,806,715 | * | 9/1998 | Hamura et al. | 221/174 X |
| 6,018,289 | * | 1/2000 | Sekura et al. | 221/15 X |
| 6,073,800 | * | 6/2000 | Saito et al. | 221/212 X |

* cited by examiner

Primary Examiner—Christopher P. Ellis
Assistant Examiner—Gene O. Crawford
(74) Attorney, Agent, or Firm—Burns, Doane, Swecker & Mathis, LLP

(57) ABSTRACT

An electronic chip component feeder is provided to prevent continued supply of electronic chip components for mounting which have surface discolorization, deteriorated electrode solderability, or cracks or chips produced by chip collisions. The electronic chip component feeder includes plural feeding units arranged in an array. Each feeding unit has a hopper for holding a plurality of components of a particular kind, and a guide path by which components are transferred from the hopper to a dispensing location. At the dispensing location, the components are picked up by a sucking chuck and then transferred to a substrate for mounting thereon. The plurality of feeding units are capable of being reciprocated in unison so that the dispensing location for the feeding units are successively moved to a fixed position. The electronic chip component feeder further includes a counting unit for counting the number of movements of the each feeding unit. This provides a measure of the degree of potential degradation of the electronic chip components in the hoppers caused by movement of their respective feeding unit. An alarm can be generated when the counted number reaches a predefined number, set individually for each feeding unit.

24 Claims, 1 Drawing Sheet

FEEDER FOR ELECTRONIC CHIP COMPONENTS

This application corresponds to Japanese Patent Application No. 10-13687 filed on Jan. 27, 1998, which is hereby incorporated by reference in its entirety.

BACKGROUND OF THE INVENTION

1. Field of the Invention

The present invention relates to an electronic chip component feeder, and more specifically relates to an electronic chip component feeder in which a plurality of feeding units respectively supply each of a plurality of kinds of chip components and are reciprocated (e.g., moved back and forth) in the course of a feeding operation.

2. Description of the Related Art

Most electronic components capable of being surface-mounted, such as capacitors, resistors and inductors, are chip-shaped (e.g., have a small box-like, cylindrical or other shapes). In order to mount such electronic components on a substrate, a chip mounter is used. An electronic chip component feeder is built into the chip mounter.

The electronic chip component feeder separately supplies a plurality of kinds of electronic chip components, respectively, through a plurality of feeding units disposed in parallel with each other. Each feeding unit has a hopper which accommodates and discharges a plurality of components of a specific kind. Further, each feeding unit has a guide path which guides the components discharged by the hopper in alignment to a predetermined dispensing location.

The plurality of feeding units can be arranged in an array, such as a linear array. The feeding units can be reciprocated (e.g., moved back and forth) in unison in an "array direction," e.g., in a direction defined by the arrangement of the feeding units in the array. By this reciprocating transfer, the dispensing location through which the components are dispensed can be transferred to a predefined fixed position. The components located at the dispensing location, which is made coincident with the fixed position, are removed one by one using a pick-up mechanism. The pick-up mechanism may comprise, for example, a sucking chuck which picks up and holds components by exerting a vacuum sucking force. The pick-up mechanism is controlled so as to repeatedly reciprocate (e.g., move back and forth) between the above-mentioned fixed position and a position at which a chip component is mounted during a mounting operation (referred to as the "mounting position").

As described above, the mounting operation of the chip components is achieved by repeated reciprocation of the pick-up mechanism between the fixed position and the mounting position. The plurality of feeding units must be transferred in a desired direction and over a desired distance to make the dispensing location of a particular feeding unit coincident with the predefined fixed position. This operation is performed repeatedly, so as to pick-up components in a desired order and mount desired kinds of components using the pick-up mechanism.

Accordingly, a feeding unit is generally moved and stopped several times in the course of mounting operations. Therefore, the chip components, accommodated in the hopper of the feeding unit, repeatedly collide with each other or with the hopper walls at every acceleration and deceleration of the unit (e.g., when the movement of the hopper starts and stops). Further, in order to speed up the mounting operation, the unit is moved quickly using rapid accelerations and decelerations (that is, movement starts and stops quickly). This can apply a substantial amount of mechanical shock to the electronic chip components during the above-described collisions.

Moreover, a huge number of electronic chip components, from several hundreds up to several millions for example, are accommodated in the hopper of each feeding unit during mounting operations. Depending on the requirements of a particular mounting operation, some components have a comparatively short stay in the hopper, while other components remain in the hopper for a relatively long time. For example, most of the components which are consumed in small quantities in the mounting process remain in the hopper for a relatively long time.

When the components remaining in the hopper for a long time undergo repeated collisions in the manner described above, the quality of the electronic chip components may degrade. For example, chipping and cracking of the electronic chip components may occur. Also, substantial discoloring of the outer surface or degradation in solderability of components having electrodes formed on the outer surface thereof may occur.

The mounting of defective electronic chip components to a substrate results in the production of substandard circuit boards. This, in turn, may require replacement of defective components, which reduces productivity.

SUMMARY OF THE INVENTION

Accordingly, it is an object of the present invention to provide an electronic chip component feeder to solve at least the aforementioned problems.

In accordance with one exemplary embodiment, an electronic chip component feeder is provided for feeding a plurality of kinds of electronic chip components, the components having electrodes on their respective outer surfaces. The electronic chip component feeder comprises a plurality of feeding units disposed in parallel with each other. Each of the feeding units includes a hopper for accommodating and discharging a plurality of electronic chip components of a specific kind, and a guide path for aligning and leading the electronic chip components discharged from the hopper to a predetermined dispensing location.

A plurality of the feeding units are arranged in an array. The feeding units can be reciprocated in unison so that the dispensing location of a feeding unit for supplying the electronic chip components to be dispensed is transferred to a fixed position. The electronic chip component feeder further comprises a pick-up mechanism for picking-up the electronic chip components forwarded to the dispensing location.

The electronic chip component feeder also includes a counting unit for counting the number of the reciprocating transfers of each feeding unit.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENTS

Figure 1:
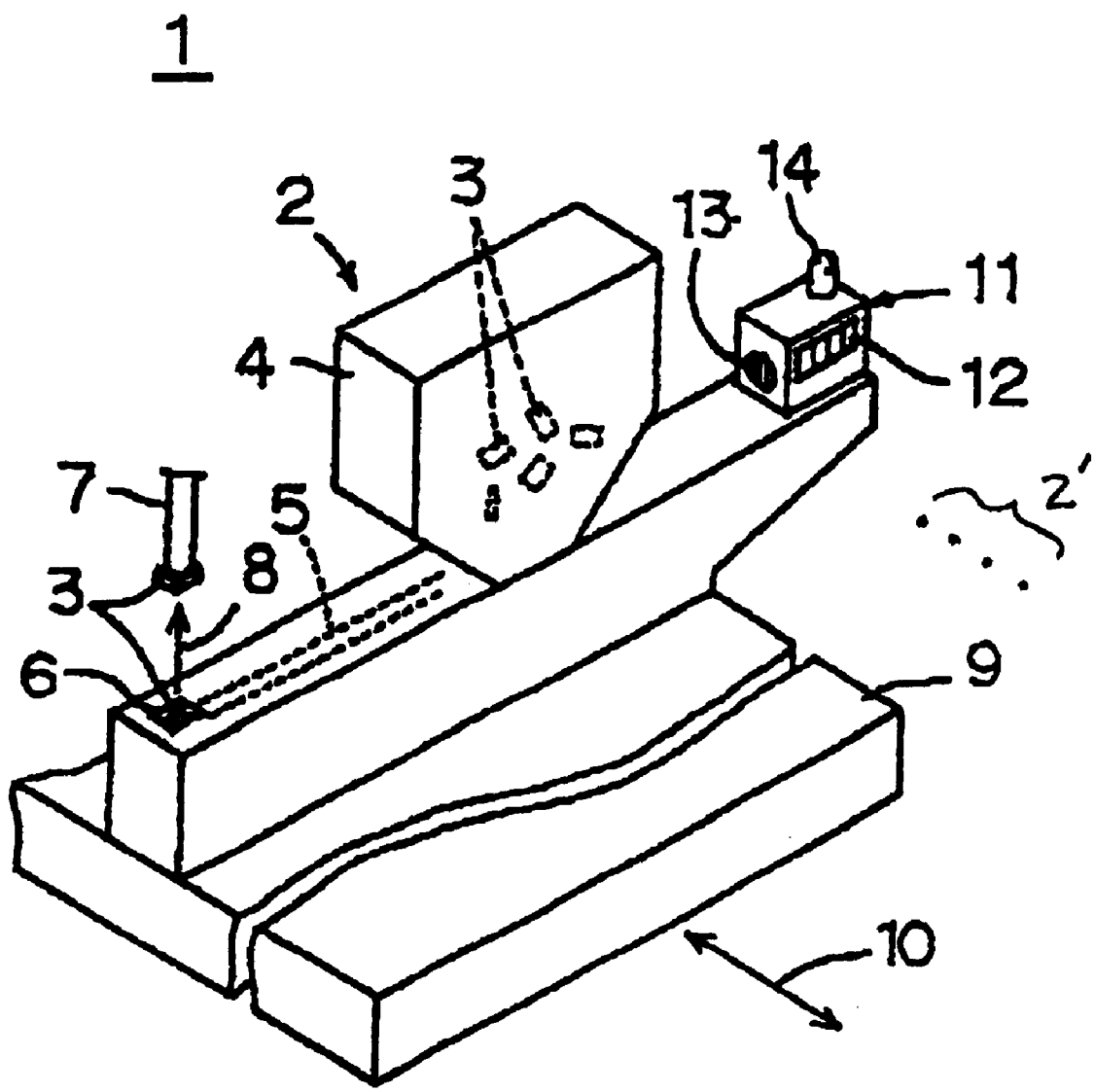
FIG. 1 is a perspective view showing a main part of an electronic chip component feeder according to an exemplary embodiment of the present invention.

In FIG. 1, one exemplary feeding unit 2 of an electronic component feeder is illustrated. The feeding unit 2 has a hopper 4, which accommodates and discharges a plurality of electronic chip components 3 of a specific kind. The electronic chip components 3 have electrodes (not shown) formed on the outer surfaces thereof, for example, as in the case of conventional monolithic ceramic capacitors. The electronic chip components 3 discharged from the hopper 4 are led to a predetermined dispensing location 6 via a guide path 5. The electronic chip components 3 are aligned when passing through the guide path 5. The guide path 5 comprises a channel, indicated by broken lines in the drawing.

The electronic chip components 3 led to the dispensing location 6 in an aligned state, as described above, are taken out from the dispensing location 6 as shown by arrow 8. The electronic chip components 3 are sucked and held by a sucking chuck 7, which functions as pick-up mechanism. The electronic chip components 3 held by the sucking chuck 7 are then mounted at a desired position (i.e., a "mounting position") on a substrate (not shown) by moving the sucking chuck 7 to the desired mounting position.

In one mounter, a plurality of feeding units 2, described above, are placed in an array on a transfer table 9. The presence of additional feeding units is indicated by the dots labeled 2'. One sucking chuck 7 is preferably provided to service one mounter and is controlled so as to repeatedly reciprocate between two positions during mounting operation, e.g., between the dispensing location and the mounting position. The transfer table 9 is controlled by a moving mechanism (not shown) so as to reciprocate in the directions shown by double-headed arrow 10 in order to dispense desired electronic chip components 3 in a desired order using the sucking chuck 7. This results in the plurality of feeding units 2 reciprocating in unison in the array direction, e.g., in the direction in which feeding units are arranged in the array. In this reciprocating movement, a plurality of feeding units 2 are transferred in a desired direction over a desired distance so that the dispensing location 6 of a specific feeding unit 2 is brought to the fixed position. As described above, the fixed position corresponds to one end point position in the reciprocating movement of the sucking chuck 7.

In one embodiment, each feeding unit 2 includes a counting mechanism 11 for counting the number of movements of each feeding unit 2. The collection of counting mechanisms 11 for all feeding units 2 can be generally referred to as a "counting unit." Each counting mechanism 11 includes a sensor (not shown) for sensing the movement of each respective feeding unit 2. The sensor may be of a type which responds to inertial changes, such as a sensor which senses the inertial force exerted on a plumb (e.g., like in a conventional pedometer). Alternatively, the sensor may use a pair of a mechanical or electrical contact switch and a contact piece to drive the switch disposed on the moving feeding unit 2 and a stationary position, respectively. Alternatively, the sensor can comprise a reflective or a translucent optical sensing mechanism. Those skilled in the art will appreciate that other types of sensors can be used. In general terms, the count generated by the counting mechanism 11 for each feeding unit 2 is representative of the amount of time the components have remained in the hopper 4 of the feeding unit 2, and thus is representative of the degree of potential degradation suffered by the components in the hopper 4.

The counting mechanism 11 is also provided with a display 12 to display the counted number produced by the counting mechanism 11, and an alarm generating mechanism for generating an alarm when the counted number reaches a predetermined number. The alarm generating mechanism can include an alarm sound generator 13 and/or an alarm light generator 14. The alarm sound generator 13 is provided with, for example, an alarm generating circuit and a speaker, buzzer or other sound producing mechanism. The alarm light generator 14 can be formed by an incandescent lamp, an LED, LCD or other visual indication mechanism.

The predetermined number which sets off the alarm generating mechanism is preferably individually selectable for respective feeding units 2. This is because the electronic chip components 3 are used at different rates in a series of mounting in a desired direction over a desired distance so that the dispensing location 6 of a specific feeding unit 2 is brought to the fixed position. As described above, the fixed position corresponds to one end point position in the reciprocating movement of the sucking chuck 7.

In one embodiment, each feeding unit 2 includes a counting mechanism 11 for counting the number of movements of each feeding unit 2. The collection of counting mechanisms 11 for all feeding units 2 can be generally referred to as a "counting unit." Each counting mechanism 11 includes a sensor (not shown) for sensing the movement of each respective feeding unit 2. The sensor may be of a type which responds to inertial changes, such as a sensor which senses the inertial force exerted on a plumb (e.g., like in a conventional pedometer). Alternatively, the sensor may use a pair of a mechanical or electrical contact switch and a contact piece to drive the switch disposed on the moving feeding unit 2 and a stationary position, respectively. Alternatively, the sensor can comprise a reflective or a translucent optical sensing mechanism. Those skilled in the art will appreciate that other types of sensors can be used. In general terms, the count generated by the counting mechanism 11 for each feeding unit 2 is representative of the amount of time the components have remained in the hopper 4 of the feeding unit 2, and thus is representative of the degree of potential degradation suffered by the components in the hopper 4.

The counting mechanism 11 is also provided with a display 12 to display the counted number produced by the counting mechanism 11, and an alarm generating mechanism for generating an alarm when the counted number reaches a predetermined number. The alarm generating mechanism can include an alarm sound generator 13 and/or an alarm light generator 14. The alarm sound generator 13 is provided with, for example, an alarm generating circuit and a speaker, buzzer or other sound producing mechanism. The alarm light generator 14 can be formed by an incandescent lamp, an LED, LCD or other visual indication mechanism.

The predetermined number which sets off the alarm generating mechanism is preferably individually selectable for respective feeding units 2. This is because the electronic chip components 3 are used at different rates in a series of mounting operations so that the stay period in the hopper 4 differs for each kind of electronic chip component 3.

It is preferable to stop the movement of the feeding unit 2 when the counted number produced by the counting mechanism 11 reaches the predetermined number. Then, when the feeding unit 2 which generated the alarm is stopped, the electronic chip components 3 accommodated in its hopper 4 may be replaced by new components. The countering mechanism 11 can be reset by a resetting mechanism (not shown).

While the present invention has been described with reference to the embodiment shown in the drawing, various modifications can be made. For example, although the counting mechanism 11 is shown positioned on the feeding unit 2, along with all its components (including the display 12, the alarm sound generator 13, and the alarm light generator 14), it may also be preferable to place the display 12 and/or the alarm generating mechanism in another position such as a central control panel. In this embodiment, only the sensor which detects the movement of the feeding unit 2 would be located at the feeding unit 2.

Any of the alarm sound generator 13 and the alarm light generator 14 may be provided alone. Without these alarm generators, the replacing time of the electronic chip components 3 accommodated in the hopper 4 can be determined by checking the display 12 or by recognizing the stopping of the feeding unit 2.

When the counted number produced by the counting mechanism 11 reaches a predetermined number, the feeding unit 2 may be manually or automatically stopped. To this end, a manual or automatic stopping mechanism can be used.

As described above, in accordance with the present invention, due to the counting mechanism for counting the number of movements of the feeding unit of the electronic chip component feeder, the replacing time of the electronic chip components in the hopper can be easily determined by monitoring the counted number produced by the counting mechanism. Accordingly, the components are less likely to degrade prior to being mounted. More specifically, there is a reduced chance of discoloration of electronic chip components, degradation in solderability of electrodes, chipping and cracking. This results in improvements in productivity, eliminating losses in processing such as would result in producing a substandard circuit board and then having to replace the defective electronic chip components mounted on the circuit board. Also, reduction of production cost, increase in the amount of production, and reduction of labor cost may be achieved, simultaneously.

In one embodiment, a conventional type of electronic chip component feeder can be adapted by providing each feeder unit with a counting mechanism. This has the advantage of quickly and efficiently implementing the invention with low cost. The counting mechanisms can be fed by a common or local power source (e.g., "local" with respect to each feeding unit). A battery power source (not shown) is preferably used, one for each feeding unit.

By virtue of the use of the alarm generating mechanism, the feeding unit requiring replacement of its electronic chip components can be easily identified, among a plurality of the feeding units.

By virtue of the fact that the alarms can be set to go off for different predetermined numbers for different respective feeding units, the alarm timings can be adjusted to reflect different rates at which the electronic chip components are consumed. Further, there may be some cases in which the required quality level or tolerance for degradation caused by the collisions differs for respective kinds of the electronic chip components. The alarm setting can be appropriately adjusted to account for this.

In the electronic chip component feeder in accordance with the present invention, if a stopping mechanism is provided for stopping the movement of the feeding unit when the counted number produced by the counting mechanism reaches a predetermined number, the timing for replacing the electronic chip components can be detected by noting the stoppage. Continued supply of electronic chip components after the predetermined number has been reached (indicating that the components should be replaced) is also definitely avoided. In this case, if the alarm generating mechanism described above is further provided, when the feeding units stop, the feeding unit requiring replacement of the electronic chip components can be instantly known.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. An electronic chip component feeder for feeding a plurality of kinds of electronic chip components, said electronic chip component feeder comprising:

a plurality of feeding units, each said feeding unit including a hopper for accommodating and discharging a plurality of electronic chip components, and a guide path for aligning and leading the electronic chip components discharged from said hopper to a predetermined dispensing location;

a mechanism for moving said feeding units in unison so that their respective dispensing locations are successively transferred to a fixed position;

a picking-up mechanism for picking-up electronic chip components placed at said fixed position;

a counting unit for generating a measure representative of the amount of potential degradation suffered by said electronic components while in the hoppers of their respective feeding units.

2. The electronic chip component feeder according to claim 1, wherein said counting unit includes, for each of said feeding units, a display which indicates a measured count number.

3. The electronic chip component feeder according to claim 1, wherein said counting unit includes a centrally disposed control panel which indicates the count status of each of said feeding units.

4. The electronic chip component feeder according to claim 1, wherein the amount of potential degradation is due to movement of the feeding units.

5. The electronic chip component feeder according to claim 1, wherein said counting unit comprises a plurality of counting mechanisms which are positioned on respective feeding units.

6. The electronic chip component feeder according to claim 5, wherein said counting mechanisms are individually powered by respective battery supplies.

7. The electronic chip component feeder according to claim 1, wherein said counting unit includes a sensor which detects movement of said feeding units.

8. The electronic chip component feeder according to claim 7, wherein said sensor detects movement by sensing changes in inertia.

9. The electronic chip component feeder according to claim 7, wherein said sensor detects movement by sensing contact between a switch and a stationary contact piece.

10. The electronic chip component feeder according to claim 7, wherein said sensor detects movement by sensing optical reflectance or translucence.

11. The electronic chip component feeder according to claim 1, wherein said counting unit includes, for each of said feeding units, an alarm which indicates when a measured count number exceeds a predetermined count number.

12. The electronic chip component feeder according to claim 11, wherein said predetermined count number for each feeding unit can be individually set.

13. An electronic chip component feeder according to claim 11, further comprising a stopping mechanism for stopping the movement of a feeding unit when the counted number associated with the feeding unit reaches the predetermined number.

14. The electronic chip component feeder according to claim 11, wherein said alarm includes at least one of: an alarm which generates a visual indication and an alarm which generates an audible indication.

15. A method for feeding electronic components using an electronic chip component feeder having a plurality of feeding units, each feeding unit having a hopper and a dispensing location, comprising the steps of:

repeatedly moving each feeding unit such that its dispensing location is made coincident with a fixed position;

repeatedly transferring electronic components from the dispensing locations of respective feeding units to a mounting surface when said dispensing locations are made coincident with said fixed position;

generating a count, for each feeding unit, which reflects the potential degradation of electronic units accommodated within the hoppers of each respective feeding unit; and stopping the transfer of electronic components to said mounting surface from any feeding unit in which a count exceeds a predetermined number.

16. The method of claim 15, wherein a different predetermined number is set for each respective feeding unit.

17. The method of claim 15, further including the step of generating an alarm when, for any feeding unit, its count exceeds said predetermined number.

18. The method of claim 15, further including the step of displaying the count of each said feeding unit.

19. A feeding unit for use in an electronic chip component feeder for feeding electronic chip components, said feeding unit comprising:

a hopper for accommodating and discharging a plurality of electronic chip components;

a guide path for aligning and leading the electronic chip components discharged from said hopper to a predetermined dispensing location;

a count mechanism for generating a count representative of the amount of potential degradation suffered by said electronic components while in the hopper; and an indication mechanism for indicating when said count exceeds a predetermined value, indicating that said electronic components in said hopper need to be replaced.

20. The feeding unit according to claim 19, wherein said counting mechanism includes a sensor which detects movement of said feeding unit.

21. The feeding unit according to claim 19, wherein said indication mechanism includes at least one of: an alarm which generates a visual indication and an alarm which generates an audible indication.

22. The feeding unit according to claim 19, wherein the amount of potential degradation is due to movement of the hopper.

23. An electronic chip component feeder for feeding a plurality of kinds of electronic chip components, said electronic chip component feeder comprising:

a plurality of feeding units, each said feeding unit including a hopper for accommodating and discharging a plurality of electronic chip components which are randomly arranged m the hopper, and a guide path for aligning and leading the electronic chip components discharged from said hopper to a predetermined dispensing location;

a mechanism for reciprocating said feeding units in unison so that their respective dispensing locations are successively transferred to a fixed position;

a picking-up mechanism for picking-up electronic chip components placed at said fixed position; and a counting unit for generating a measure representative of the amount of potential degradation suffered by said electronic components while in the hoppers of their respective feeding units.

24. The electronic chip component feeder according to claim 23, wherein said counting unit counts the reciprocal movement of said respective feeding units.

* * * * *